United States Patent
Matsumoto et al.

(10) Patent No.: US 9,520,177 B2
(45) Date of Patent: Dec. 13, 2016

(54) SEMICONDUCTOR DEVICE HAVING HIERARCHICAL SENSE AMPLIFIERS ASSIGNED TO MULTIPLE LOCAL BIT LINES

(71) Applicant: PS4 Luxco S.a.r.l., Luxembourg (LU)

(72) Inventors: Yasuhiro Matsumoto, Tokyo (JP); Kyoichi Nagata, Tokyo (JP); Izumi Nakai, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/438,739

(22) PCT Filed: Nov. 5, 2013

(86) PCT No.: PCT/JP2013/079873
§ 371 (c)(1),
(2) Date: Apr. 27, 2015

(87) PCT Pub. No.: WO2014/080756
PCT Pub. Date: May 30, 2014

(65) Prior Publication Data
US 2015/0302914 A1   Oct. 22, 2015

(30) Foreign Application Priority Data

Nov. 22, 2012  (JP) ................. 2012-255943
Mar. 12, 2013  (JP) ................. 2013-048770

(51) Int. Cl.
*G11C 7/00* (2006.01)
*G11C 11/4091* (2006.01)
(Continued)

(52) U.S. Cl.
CPC ........ *G11C 11/4091* (2013.01); *G11C 11/4094* (2013.01); *G11C 11/4097* (2013.01)

(58) Field of Classification Search
CPC .......... G11C 7/12; G11C 11/4094; G11C 7/22
(Continued)

(56) References Cited

U.S. PATENT DOCUMENTS 4,970,685 A    11/1990  Koyanagi
5,991,223 A *  11/1999  Kozaru ............... G11C 7/1018
                                                 365/230.03
(Continued)

FOREIGN PATENT DOCUMENTS

JP    02143982    6/1990
JP    06119774    4/1994
JP    11045564    2/1999

OTHER PUBLICATIONS

Application No. PCT/JP2013/079873, International Search Report, Feb. 25, 2014.

*Primary Examiner* — Connie Yoha
(74) *Attorney, Agent, or Firm* — Kunzler Law Group, PC

(57) ABSTRACT

A semiconductor device is equipped with memory cells which are provided at the intersections of word lines and local bit lines, hierarchical switches which are respectively connected between the local bit lines and a global bit line, and a hierarchical sense amplifier which amplifies a potential difference generated between signal nodes, with the signal nodes being respectively connected to the local bit lines. According to the present invention, because the hierarchical sense amplifier is a differential type circuit, a stable sensing operation can be performed. In addition, because one hierarchical sense amplifier can be assigned to multiple local bit lines, the number of hierarchical sense amplifiers can be reduced.

23 Claims, 14 Drawing Sheets

(51) Int. Cl.
*G11C 11/4094* (2006.01)
*G11C 11/4097* (2006.01)

(58) Field of Classification Search
USPC .............. 365/205, 203, 207, 154, 230.04,
230.08,365/230.09
See application file for complete search history.

(56) References Cited

U.S. PATENT DOCUMENTS

| | | | | |
|---|---|---|---|---|
| 6,094,392 | A * | 7/2000 | Utsugi | G11C 7/06 365/189.11 |
| 8,693,236 | B2 * | 4/2014 | Shu | G11O 5/063 365/154 |
| 2008/0291764 | A1 * | 11/2008 | Kajigaya | G11C 11/4097 365/205 |

* cited by examiner

SEMICONDUCTOR DEVICE HAVING HIERARCHICAL SENSE AMPLIFIERS ASSIGNED TO MULTIPLE LOCAL BIT LINES

TECHNICAL FIELD

The present invention relates to a semiconductor device, and in particular relates to a semiconductor device having bit lines that are separated hierarchically.

BACKGROUND ART

Semiconductor devices, typified by DRAMs (Dynamic Random Access Memory), include those in which the bit lines are separated hierarchically into local bit lines and global bit lines (see patent literature article 1). The local bit lines are lower-order bit lines which are connected to memory cells. Meanwhile, the global bit lines are higher-order bit lines which are connected to global sense amplifiers. Separating the bit lines hierarchically makes it possible to increase the number of memory cells allocated to one global sense amplifier, while reducing the wiring line length of the local bit lines, which have a relatively high electrical resistance.

The semiconductor device described in patent literature article 1 is provided with local sense amplifiers (LSA) connected to local bit lines.

PATENT LITERATURE

Patent literature article 1: Japanese Patent Kokai 2008-262632

SUMMARY OF THE INVENTION

Problems to be Resolved by the Invention

However, the local sense amplifiers described in patent literature article 1 are what are known as single-end type sense amplifiers in which the local bit lines are connected to the gates of input transistors comprising vertical MOS transistors, and therefore, because the sense margin varies as a result of variability in the characteristics of the input transistors contained in the local sense amplifiers, there is a problem in that process control during manufacture is difficult. In patent literature article 1 there is also a problem in that it is necessary to allocate a local sense amplifier to each local bit line.

Means of Overcoming the Problems

The semiconductor device according to the present invention is characterized in that it is provided with: a global bit line; a global sense amplifier which amplifies a signal on the global bit line; first and second local bit lines; a plurality of word lines which each intersect at least one of the first and second local bit lines; a plurality of memory cells disposed at the points of intersection of the plurality of word lines and the first and second local bit lines; first and second hierarchical switches connected respectively between the first and second local bit lines and the global bit line; and a hierarchical sense amplifier which has first and second signal nodes and which amplifies an electric potential difference generated between the first and second signal nodes; wherein the first signal node is connected to the first local bit line, and the second signal node is connected to the second local bit line.

Advantages of the Invention

According to the present invention, the hierarchical sense amplifier connected to the local bit lines is a differential-type circuit, and it is therefore possible for stable sensing operations to be performed. Further, because one hierarchical sense amplifier can be allocated to a plurality of local bit lines, it is also possible to reduce the number of hierarchical sense amplifiers.

MODES OF EMBODYING THE INVENTION

Preferred modes of embodiment of the present invention will now be described in detail with reference to the accompanying drawings.

Figure 1:
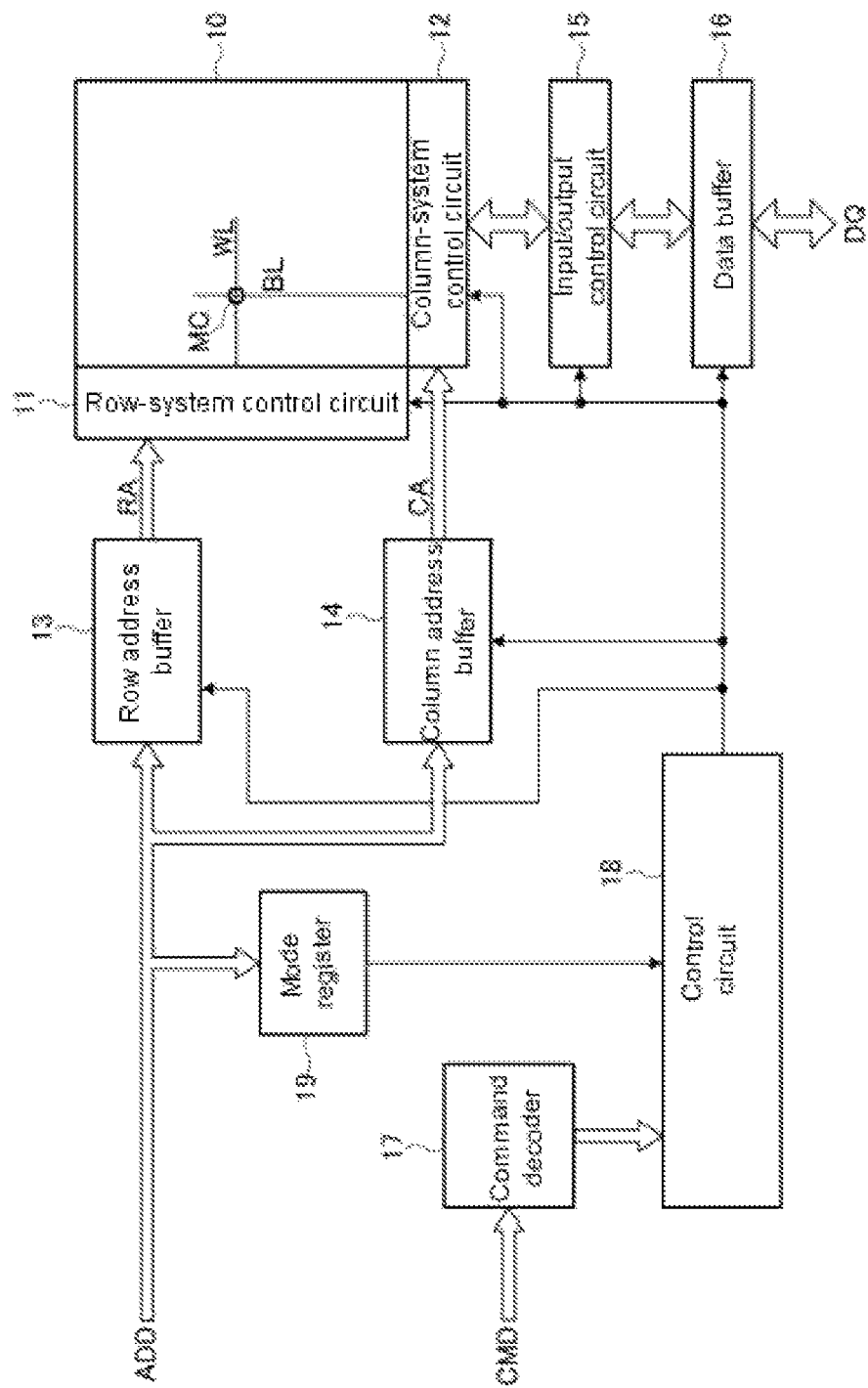
FIG. 1 is a block diagram illustrating the configuration of a semiconductor device according to a preferred mode of embodiment of the present invention.

FIG. 1 is a block diagram illustrating the configuration of a semiconductor device according to a preferred first mode of embodiment of the present invention.

As illustrated in FIG. 1, the semiconductor device according to this mode of embodiment is a DRAM (Dynamic Random Access Memory) having a memory cell array region 10. Details are discussed hereinafter, but hierarchically separated global bit lines and local bit lines are provided in the memory cell array region 10, and memory cells are disposed at the points of intersection of word lines and the local bit lines. The word lines are selected by means of a row-system control circuit 11, and the global bit lines and the local bit lines are selected by means of a column-system control circuit 12. Further, hierarchical switches, discussed hereinafter, are connected between the global bit lines and the local bit lines, control thereof also being performed by the row-system control circuit 11.

A row address RA is supplied to the row-system control circuit 11 by way of a row address buffer 13. Further, a column address CA is supplied to the column-system control circuit 12 by way of a column address buffer 14. The row address RA and the column address CA are both address signals ADD supplied from the outside, and a control circuit 18 controls to which of the row address buffer 13 and the column address buffer 14 the address signal ADD is input. The control circuit 18 is a circuit which controls each functional block on the basis of an output from a command decoder 17 which decodes external commands CMD. More specifically, if the external command CMD indicates an active command, the address signal ADD is supplied to the row address buffer 13. Further, if the external command CMD indicates a read command or a write command, the address signal ADD is supplied to the column address buffer 14.

Therefore, if an active command and a read command are issued successively, and a row address RA and a column address CA are input in synchronism therewith, data DQ in a memory cell specified by these addresses can be read. Further, if an active command and a write command are issued successively, and a row address RA and a column address CA are input in synchronism therewith, data DQ can be written to a memory cell specified by these addresses. The data DQ are written and read by way of an input/output control circuit 15 and a data buffer 16.

Further, the semiconductor device according to this mode of embodiment is provided with a mode register 19, and the set value thereof is supplied to the control circuit 18. A parameter indicating the operating mode of the semiconductor device according to this mode of embodiment is set in the mode register 19.

Figure 2:
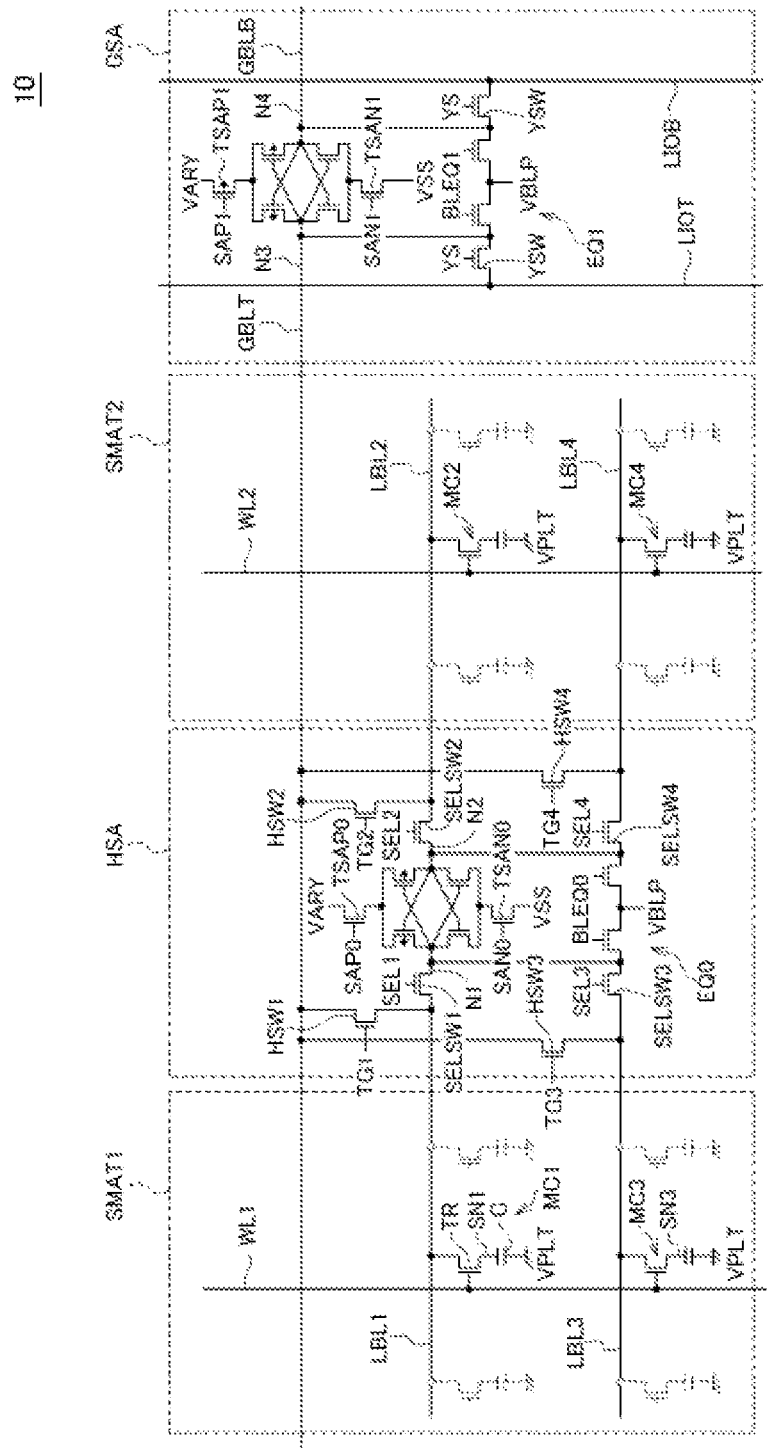
FIG. 2 is a circuit diagram used to describe the circuit configuration of a memory cell array region 10 according to a first mode of embodiment of the present invention.

FIG. 2 is a circuit diagram used to describe the circuit configuration of the memory cell array region 10 according to the first mode of embodiment of the present invention.

As illustrated in FIG. 2, a pair of global bit lines GBLT and GBLB, and a global sense amplifier GSA which amplifies the electric potential difference generated between the global bit lines GBLT and GBLB are contained in the memory cell array region 10. FIG. 2 depicts only one global sense amplifier GSA, but it goes without saying that in practice the memory cell array region 10 contains multiple global sense amplifiers GSA.

The global sense amplifier GSA has what is known as a flip-flop configuration, in which a power-supply potential VARY is supplied by way of a transistor TSAP1 to the sources of cross-coupled p-channel MOS transistors, and a ground potential VSS is supplied by way of a transistor TSAN1 to the sources of cross-coupled n-channel MOS transistors. Sense activation signals SAP1 and SAN1 are supplied respectively to the gate electrodes of the transistors TSAP1 and TSAN1. Then, the global bit line GBLT is connected to one signal node N3, and the global bit line GBLB is connected to another signal node N4. By means of said configuration, if the sense activation signals SAP1 and SAN1 are activated, then on the basis of the electric potential difference generated between the pair of global bit lines GBLT and GBLB, one of the global bit lines is driven to the power-supply potential VARY, and the other is driven to the ground potential VSS.

The signal nodes N3 and N4 are connected by way of column switches YSW to a local I/O line pair LIOT, LIOB. The column switches YSW turn on in response to a column selection signal YS. Therefore, during a read operation, read data read out by means of the global sense amplifier GSA are transferred to the local I/O line pair LIOT, LIOB by way of the column switches YSW. Further, during a write operation, write data supplied by way of the local I/O line pair LIOT, LIOB are transferred to the global bit lines GBLT and GBLB by way of the column switches YSW. Further, an equalizing circuit EQ1 is connected between the signal nodes N3 and N4. An equalizing signal BLEQ1 is supplied to the equalizing circuit EQ1, and when the equalizing signal BLEQ1 activates the equalizing circuit EQ1 the global bit lines GBLT and GBLB are precharged to an intermediate potential VBLP. The intermediate potential VBLP is a potential between the power-supply potential VARY and the ground potential VSS (=(VARY+VSS)/2).

A hierarchical sense amplifier HSA is connected to the global bit line GBLT. Only one hierarchical sense amplifier HSA connected to the global bit line GBLT is illustrated in FIG. 2, but in practice two or more hierarchical sense amplifiers HSA can be connected. Further, although not illustrated in FIG. 2, a hierarchical sense amplifier HSA is also connected to the global bit line GBLB.

The hierarchical sense amplifier HSA has the same flip-flop configuration as the global sense amplifier GSA, the power-supply potential VARY being supplied by way of a transistor TSAP0 to the sources of cross-coupled p-channel MOS transistors, and the ground potential VSS being supplied by way of a transistor TSAN0 to the sources of cross-coupled n-channel MOS transistors. Sense activation signals SAP0 and SAN0 are supplied respectively to the gate electrodes of the transistors TSAP0 and TSAN0. By means of said configuration, if the sense activation signals SAP0 and SAN0 are activated, then on the basis of the electric potential difference generated between signal nodes N1 and N2, one of the signal nodes is driven to the power-supply potential VARY, and the other is driven to the ground potential VSS.

An equalizing circuit EQ0 is connected between the signal nodes N1 and N2. An equalizing signal BLEQ0 is supplied to the equalizing circuit EQ0, and when the equalizing signal BLEQ0 activates the equalizing circuit EQ0 the signal nodes N1 and N2 are precharged to the intermediate potential VBLP.

The signal node N1 of the hierarchical sense amplifier HSA is connected to local bit lines LBL1 and LBL3 by way of selection switches SELSW1 and SELSW3. Similarly, the signal node N2 of the hierarchical sense amplifier HSA is connected to local bit lines LBL2 and LBL4 by way of selection switches SELSW2 and SELSW4. The local bit lines LBL1 to LBL4 are connected to the global bit line GBLT by way of hierarchical switches HSW1 to HSW4 respectively. The hierarchical switches HSW1 to HSW4 comprise n-channel MOS transistors, and they conduct in response to connection signals TG1 to TG4 respectively. Further, the selection switches SELSW1 to SELSW4 also comprise n-channel MOS transistors, and they conduct in response to selection signals SEL1 to SEL4.

As illustrated in FIG. 2, the local bit lines LBL1 and LBL3 belong to a submat SMAT1, and the local bit lines LBL2 and LBL4 belong to a submat SMAT2. Only one word line WL1 allocated to the submat SMAT1 and one word line WL2 allocated to the submat SMAT2 are depicted in FIG. 2, but in practice a plurality of word lines are allocated to each submat SMAT1 and SMAT2. The word line WL1 allocated to the submat SMAT1 intersects the local bit lines LBL1 and LBL3, and the word line WL2 allocated to the submat SMAT2 intersects the local bit lines LBL2 and LBL4.

The memory cells of the DRAM are disposed at the points of intersection of the word lines and the local bit lines. FIG. 2 depicts only memory cells MC1 and MC3 disposed respectively at the points of intersection of the word line WL1 and the local bit lines LBL1 and LBL3, and memory cells MC2 and MC4 disposed respectively at the points of intersection of the word line WL2 and the local bit lines LBL2 and LBL4, but in practice multiple memory cells MC are provided in each submat. The memory cells MC1 to MC4 have a configuration in which a cell transistor TR and a cell capacitor C are connected in series between the corresponding local bit line LBL and a plate wiring line VPLT, and the gate electrode of the cell transistor TR is connected to the corresponding word line WL.

The circuit configuration of the memory cell array region 10 is as described hereinabove. The operation of the semiconductor device according to this mode of embodiment will now be described.

As has already been explained, access to the semiconductor device in this mode of embodiment is effected by successively issuing an active command and a read command or a write command, and inputting the row address RA and the column address CA in synchronism therewith. Here, if the row address RA is input in synchronism with an active command, then row access, in other words a word line selection operation and a concomitant sensing operation, is performed, and if the column address CA is input in synchronism with a read command or a write command then column access, in other words a global sense amplifier GSA selection operation and a concomitant read data input operation or write data output operation, is performed. Of these, the semiconductor device according to this mode of embodiment is characterized by its operation during row access, and therefore the operation during row access will now be described in detail.

Figure 3:
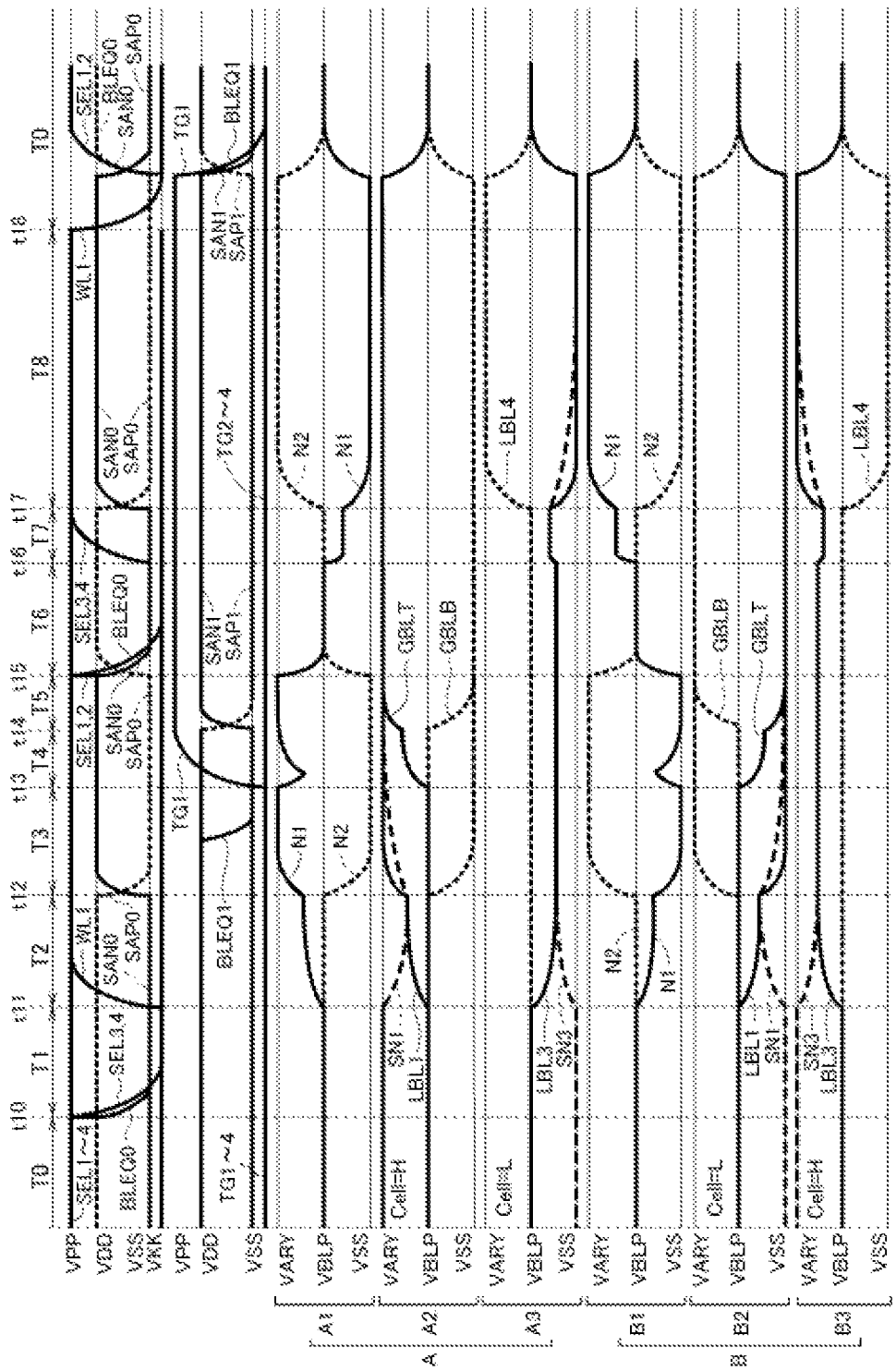
FIG. 3 is an operational waveform diagram used to describe the operation of a semiconductor device according to a preferred first mode of embodiment of the present invention during row access.

FIG. 3 is an operational waveform diagram used to describe the operation of the semiconductor device according to this mode of embodiment during row access.

A period T0 up to a time t10 illustrated in FIG. 3 is a precharge period prior to the time at which the row access is performed. During the period T0, the selection signals SEL1 to SEL4 are all at the high level, and the connection signals TG1 to TG4 are all at the low level. In other words, the state is such that the local bit lines LBL1 to LBL4 are disconnected from the global bit line GBLT, and the local bit lines LBL1 to LBL4 are connected to the hierarchical sense amplifier HSA. Further, the equalizing signals BLEQ0 and BLEQ1 are both at the high level, and therefore the global bit line GBLT and the local bit lines LBL1 to LBL4 are all precharged to the intermediate potential VBLP.

If in this state the row address RA is input in synchronism with an active command, then the control circuit 18 and the row-system control circuit 11 illustrated in FIG. 1 begin the row access described hereinbelow. The following description describes an example in which the row address RA indicating the memory cell MC1 illustrated in FIG. 2 is input. It should be noted that the following operation is executed mainly under the control of the control circuit 18 and the row-system control circuit 11.

When the row address RA indicating the memory cell MC1 is input, at the time t10 the equalizing signal BLEQ0 is changed to the low level, and the selection signals SEL3 and SEL4 are changed to the low level. By this means, the precharge state of the local bit lines LBL1 to LBL4 is released, and the local bit lines LBL3 and LBL4 are isolated from the hierarchical sense amplifier HSA. The local bit lines LBL1 and LBL2 remain in a state in which they are connected to the hierarchical sense amplifier HSA. This operation continues until a time t11. A period T1 between the times t10 and t11 is a period for release of the precharge state.

At the time t11, the word line WL1 changes from a VKK level to a VPP level. The VPP level is an electric potential which turns on the cell transistors TR contained in the memory cells MC, and by this means the cell capacitors C which are constituents of the memory cells MC1 and MC3 are respectively connected to the corresponding local bit lines LBL1 and LBL3.

Here, the reference code A in FIG. 3 indicates operations for a case in which high-level and low-level data are respectively being held in the memory cells MC1 and MC3, where the reference code A1 indicates changes in the potentials of the signal nodes N1 and N2 of the hierarchical sense amplifier HSA, the reference code A2 indicates changes in the potentials of a storage node SN1 of the memory cell MC1, the local bit line LBL1 and the global bit lines GBLT and GBLB, and the reference code A3 indicates changes in the potentials of a storage node SN3 of the memory cell MC3 and the local bit line LBL3. This is also the case in FIG. 10, FIG. 11, FIG. 13 and FIG. 14 discussed hereinafter. Meanwhile, the reference code B indicates operations for a case in which low-level and high-level data are respectively being held in the memory cells MC1 and MC3, where the waveforms indicated by the reference codes B1 to B3 correspond to the waveforms indicated by the reference codes A1 to A3.

As indicated by the reference code A in FIG. 3, if high-level and low-level data are being held in the memory cells MC1 and MC3 respectively, then when the word line WL1 is activated to the VPP level, charge sharing causes the electric potential of the local bit line LBL1 to rise slightly from the intermediate potential VBLP, and the electric potential of the local bit line LBL3 to fall slightly from the intermediate potential VBLP. Conversely, as indicated by the reference code B, if low-level and high-level data are being held in the memory cells MC1 and MC3 respectively, then when the word line WL1 is activated to the VPP level, charge sharing causes the electric potential of the local bit line LBL1 to fall slightly from the intermediate potential VBLP, and the electric potential of the local bit line LBL3 to rise slightly from the intermediate potential VBLP. During the corresponding period T2, the selection switch SELSW1 is on and the selection switch SELSW3 is off, and therefore in the former case, as indicated by the reference code A1, the electric potential of the signal node N1 rises, and in the latter case, as indicated by the reference code B1, the electric potential of the signal node N1 falls. It should be noted that in both cases, the electric potential of the signal node N2 remains at the intermediate potential VBLP.

Then, at a time t12, the sense activation signals SAP0 and SAN0 are activated, and the electric potential difference generated between the signal nodes N1 and N2 is amplified. Therefore, in the case indicated by the reference code A1, the local bit line LBL1 is driven to the power-supply potential VARY and the local bit line LBL2 is driven to the ground potential VSS. Conversely, in the case indicated by the reference code B1, the local bit line LBL1 is driven to the ground potential VSS and the local bit line LBL2 is driven to the power-supply potential VARY. In both cases, because the selection switch SELSW3 is off, the electric potential of the local bit line LBL3 does not change even when the sense activation signals SAP0 and SAN0 are activated.

Further, concurrent with the abovementioned sensing operation, the equalizing signal BLEQ1 is changed to the low level, and therefore the precharge state of the global bit lines GBLT and GBLB is released. These operations continue until a time t13. A period T3 between the times t12 and t13 is a period for amplification of the electric potential of the local bit line LBL1.

Then, at the time t13, the connection signal TG1 is activated to the VPP level, turning on the hierarchical switch HSW1. The other connection signals TG2 to TG4 are maintained in an inactive state. By this means, the local bit line LBL1 is connected to the global bit line GBLT, and charge sharing takes place between these two bit lines. Therefore in the case indicated by the reference code A2, the electric potential of the global bit line GBLT rises, and in the case indicated by the reference code B2, the electric potential of the global bit line GBLT falls. In both cases, the electric potential of the other global bit line GBLB is maintained at the intermediate potential VBLP, and therefore an electric potential difference is generated between the signal nodes N3 and N4 of the global sense amplifier GSA.

At a time t14, the sense activation signals SAP1 and SAN1 are activated, and the electric potential difference generated between the signal nodes N3 and N4 is amplified. Therefore, in the case indicated by the reference code A2, the global bit line GBLT is driven to the power-supply potential VARY and the global bit line GBLB is driven to the ground potential VSS. Conversely, in the case indicated by the reference code B2, the global bit line GBLT is driven to the ground potential VSS and the global bit line GBLB is driven to the power-supply potential VARY. As a result, the data read from the memory cell MC1 are immediately re-stored by means of the global sense amplifier GSA and the hierarchical sense amplifier HSA.

The sensing state is subsequently maintained until a precharge command is issued (until a time t18). A column access can therefore be executed by inputting the column address CA in synchronism with a read command or a write command.

While the column access is being executed, the data read from the memory cell MC3 are re-stored. First, at a time t15 the selection signals SEL1 and SEL2 are changed to the low level, and the equalizing signal BLEQ0 is activated. By this means, all the selection switches SELSW1 to SELSW4 enter the off state, and the signal nodes N1 and N2 in the hierarchical sense amplifier HSA are again precharged to the intermediate potential VBLP. This operation continues until a time t16. A period T6 between the times t15 and t16 is a re-precharge period for re-storing of the data to the memory cell MC3.

Next, at the time t16 the selection signals SEL3 and SEL4 are changed to the high level. By this means, the selection switches SELSW3 and SELSW4 are turned on, and therefore the local bit lines LBL3 and LBL4 are respectively connected to the signal nodes N1 and N2 of the hierarchical sense amplifier HSA. Therefore, in the case indicated by the reference code A1 in FIG. 3, the electric potential of the signal node N1 falls slightly from the intermediate potential VBLP, and in the case indicated by the reference code B1, the electric potential of the signal node N1 rises slightly from the intermediate potential VBLP.

Then, at a time t17, the sense activation signals SAP0 and SAN0 are again activated, and the electric potential difference generated between the signal nodes N1 and N2 is amplified. Therefore, in the case indicated by the reference code A1, the local bit line LBL3 is driven to the ground potential VSS and the local bit line LBL4 is driven to the power-supply potential VARY. Conversely, in the case indicated by the reference code B1, the local bit line LBL3 is driven to the power-supply potential VARY and the local bit line LBL4 is driven to the ground potential VSS. By this means the data read from the memory cell MC3 are correctly re-stored.

When a precharge command is subsequently issued, at a time t18 the word line WL1 is deactivated, all the selection signals SEL1 to SEL4 are set to the high level and all the selection signals TG1 to TG4 are set to the low level. Further, both equalizing signals BLEQ0 and BLEQ1 are set to the high level. In other words, the state returns to the same state as that up to the time t10, and the next row access can be executed.

The operation of the semiconductor device according to this mode of embodiment is as described above. Thus in the semiconductor circuit according to this mode of embodiment the hierarchical sense amplifier HSA has a differential-type flip-flop circuit configuration, and stable sensing operations can therefore be performed.

Further, because the hierarchical sense amplifier HSA can itself perform the re-storing operation, a re-storing operation for a memory cell (MC3 in the example in FIG. 3) that is not being accessed can be performed concurrently with a read operation of a memory cell (MC1 in the example in FIG. 3) that is being accessed. This means that it is not necessary to separate the word line corresponding to the memory cell MC1 from the word line corresponding to the memory cell MC3, and therefore the array configuration can be simplified. Moreover, the re-storing operation to the memory cell MC3 that is not being accessed can be executed concurrently with the column access to the memory cell MC1 being accessed, and therefore the access efficiency does not deteriorate as a result of said re-storing operation.

Further, two or more pairs of local bit lines can be allocated to one hierarchical sense amplifier HSA, and it is therefore also possible to increase the hierarchical sense amplifier HSA arrangement pitch. Further, more local bit lines LBL can be allocated to one global bit line GBL, and it is therefore also possible to reduce the number of global sense amplifiers GSA.

Figure 4:
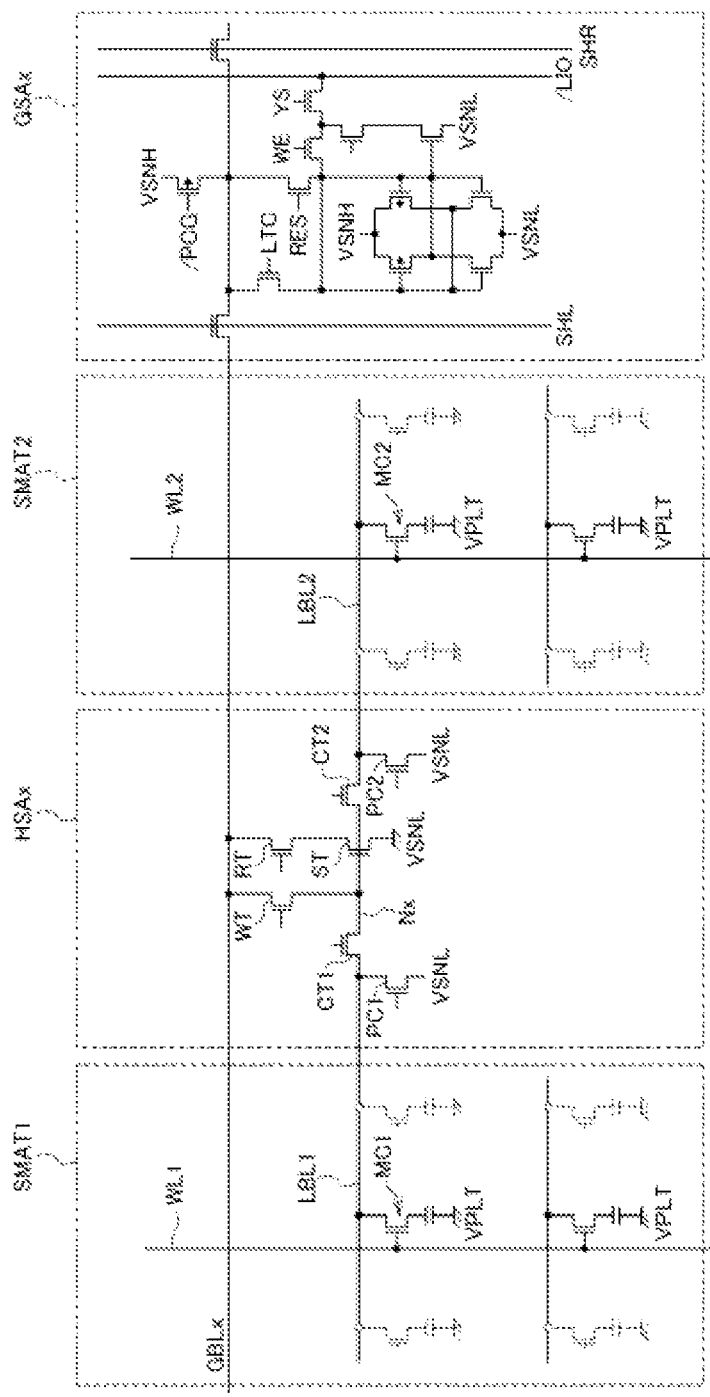
FIG. 4 is a circuit diagram used to describe the circuit configuration of a hierarchical sense amplifier HSAx according to a prototype considered by the inventors during the process leading to the present invention.

FIG. 4 is a circuit diagram used to describe the circuit configuration of a hierarchical sense amplifier HSAx according to a prototype considered by the inventors during the process leading to the present invention.

The hierarchical sense amplifier HSAx illustrated in FIG. 4 is provided with control transistors CT1 and CT2 connected respectively between a signal node Nx and local bit lines LBL1 and LBL2, a write transistor WT connected between a global bit line GBLx and the signal node Nx, and a read transistor RT connected between the global bit line GBLx and a sense transistor ST. The gate electrode of the sense transistor ST is connected to the signal node Nx, and therefore if the electric potential of the signal node Nx exceeds the threshold of the sense transistor ST, the global bit line GBLx is discharged to a low potential VSNL by way of the read transistor RT.

The operation of the hierarchical sense amplifier HSAx is as follows. First, precharging transistors PC1 and PC2 are turned on, thereby precharging the local bit lines LBL1 and LBL2 to the low potential VSNL, after which the precharge state is released. Next, data held in the memory cell MC1 are read out to the local bit line LBL1 by activating the word line WL1, for example.

Here, if the data held in the memory cell MC1 are low-level data, the electric potential of the local bit line LBL1 is maintained at the low potential VSNL, and therefore the control transistor CT1, which has the local bit line LBL1 as its source side, enters a state in which its threshold is exceeded, and it turns on. By this means, the electric potential of the signal node Nx falls, and the sense transistor ST turns off. In this case, the electric potential of the global bit line GBLTx does not change even if the read transistor RT turns on.

Meanwhile, if the data held in the memory cell MC1 are high-level data, the electric potential of the local bit line LBL1 rises slightly from the low potential VSNL. Therefore the control transistor CT1, which has the local bit line LBL1 as its source side, enters a state in which its threshold is not exceeded, and it turns off. By this means, the electric potential of the signal node Nx is maintained in the precharge state, and the sense transistor ST turns on. In this case, the electric potential of the global bit line GBLTx is discharged to the low potential VSNL when the read transistor RT turns on.

The hierarchical sense amplifier HSAx having such a configuration determines whether the data that have been read out are high-level or low-level data on the basis of the threshold voltages of the control transistors CT1 and CT2, and therefore variability in the characteristics of the control transistors CT1 and CT2 results in variations in the sense margin. This gives rise to the problem that process control during manufacture is difficult.

Figure 5:
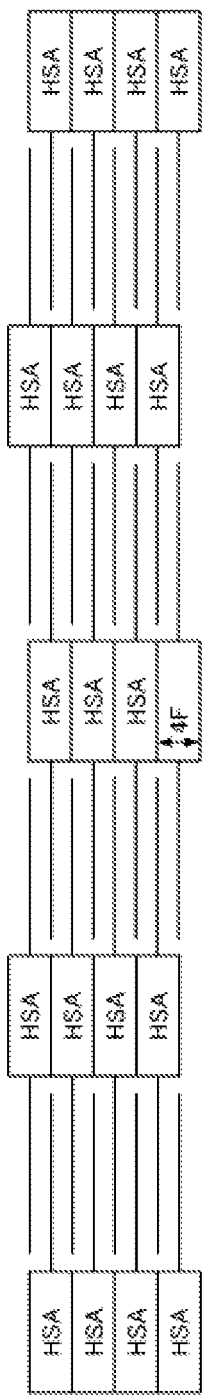
FIG. 5 is a schematic diagram used to describe the layout when the prototype hierarchical sense amplifier HSAx is employed.
Figure 6:
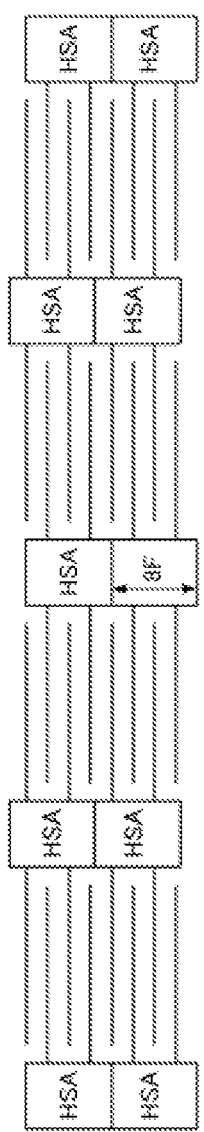
FIG. 6 is a schematic diagram used to describe a first example of the layout when the hierarchical sense amplifier HSA according to the preferred first mode of embodiment of the present invention is employed.

Further, as illustrated in FIG. 5, if the hierarchical sense amplifier HSAx illustrated in FIG. 4 is employed, its arrangement pitch is twice the arrangement pitch of the local bit lines LBL, and therefore the density with which the hierarchical sense amplifiers HSAx must be disposed is very high. For example, if the arrangement pitch of the local bit lines LBL is 2F (where F is a minimum processing dimension), then the arrangement pitch of the hierarchical sense amplifiers HSAx is 4F. In contrast, as illustrated in FIG. 6, if the hierarchical sense amplifier HSA illustrated in FIG. 2 is employed, its arrangement pitch can be increased to four times the arrangement pitch of the local bit lines LBL (8F). This generates spare space in the layout of the hierarchical sense amplifiers HSA, and it is therefore also possible to reduce the width of the hierarchical sense amplifiers HSA in the local bit line LBL direction. This gives rise to a reduction in the size of the memory cell array region 10. Further, even if the width of the hierarchical sense amplifiers HSA is not reduced, processing rules can be relaxed.

It should be noted that the layout illustrated in FIG. 6 is an example in which the hierarchical sense amplifiers HSA are disposed in a dispersed manner, and in which the local bit lines LBL are connected alternately to hierarchical sense amplifiers HSA located to the left and the right. In other words, one local bit line LBL connected to a certain hierarchical sense amplifier HSA is disposed between two local bit lines LBL connected to another hierarchical sense amplifier HSA. The F-value in the hierarchical sense amplifier HSA can thus be relaxed, and this has the merit that if in the future it becomes problematic to arrange bit lines (tungsten wiring lines), in particular, within the hierarchical sense amplifier HSA, relaxing the F-value allows the hierarchical sense amplifier HSA to be laid out up to one generation ahead.

Figure 7:
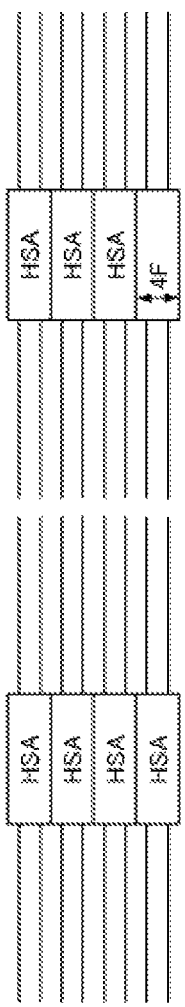
FIG. 7 is a schematic diagram used to describe a second example of the layout when the hierarchical sense amplifier HSA according to the preferred first mode of embodiment of the present invention is employed.

In contrast, the layout illustrated in FIG. 7 is an example in which the hierarchical sense amplifiers HSA are disposed in a centralized manner, and in which the two local bit lines LBL connected to each hierarchical sense amplifier HSA do not have another wiring line disposed therebetween. With such a layout, it is not necessary to provide hierarchical sense amplifiers HSA in the end portions of the memory cell array region, in addition to which the total number of hierarchical sense amplifiers HSA is reduced, and it is therefore possible to reduce the size of the memory cell array region 10 further. It should be noted that with the layout illustrated in FIG. 6, local bit lines LBL which serve as a reference side do not exist in the hierarchical sense amplifiers HSA located in the end portions, and in some cases the sensing operation may therefore be problematic. In order to prevent such problems it is necessary to implement countermeasures such as obtaining a balance between the signal nodes N1 and N2 by turning off the selection switches SELSW1 to SELSW4 immediately prior to starting sensing, and there is thus a possibility that another problem may arise, namely that it is necessary for only the hierarchical sense amplifiers HSA located in the end portions to be controlled using a different sequence. In contrast, such problems do not arise if the layout illustrated in FIG. 7 is employed.

It should be noted that the layout illustrated in FIG. 7 has the merits that, although the hierarchical sense amplifiers HSA themselves have the same F-value as in the prior art, by laying out the hierarchical sense amplifiers HSA in a centralized manner it is possible to minimize the separation region between the array and the hierarchical sense amplifiers, and by sharing part of the logic, the surface area can be reduced compared with the prior art.

A second mode of embodiment of the present invention will now be described.

Figure 9:
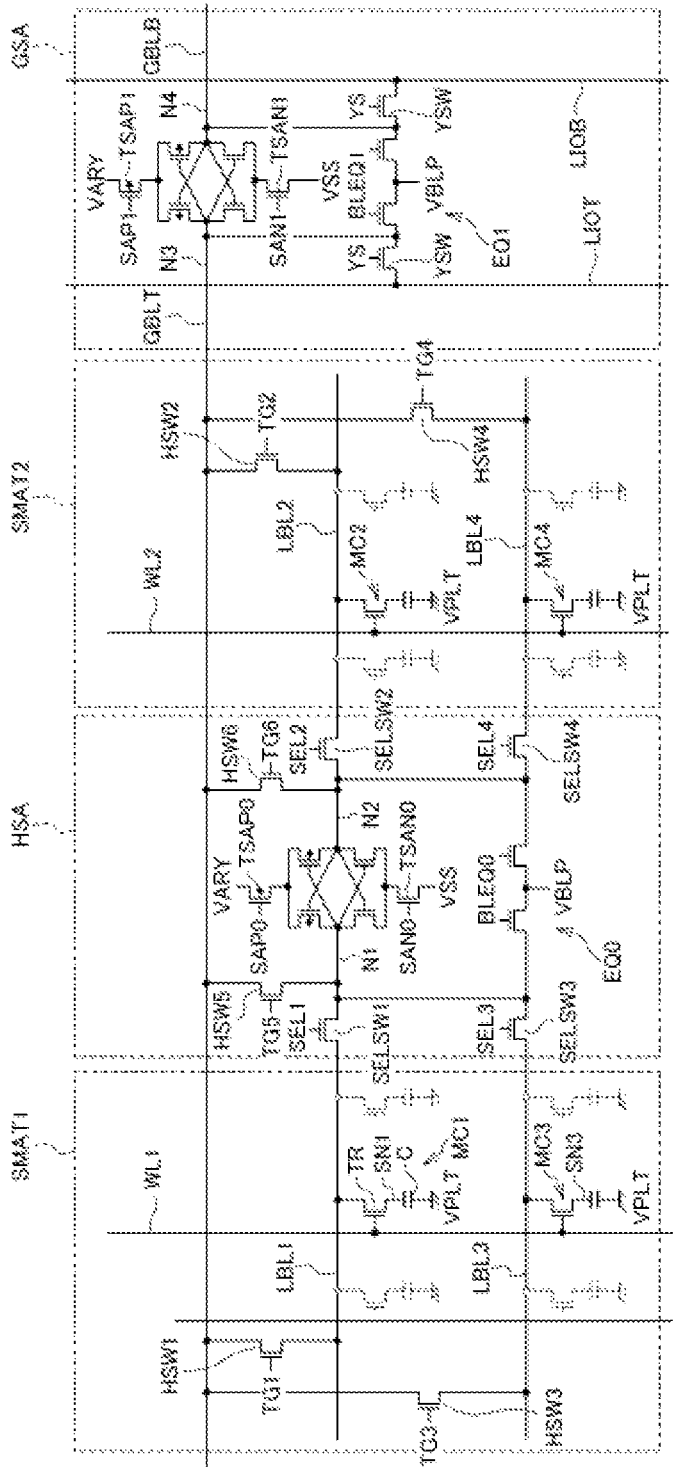
FIG. 9 is a circuit diagram used to describe the circuit configuration of a memory cell array region 10 according to a second mode of embodiment of the present invention.

FIG. 9 is a circuit diagram used to describe the circuit configuration of the memory cell array region 10 according to the second mode of embodiment of the present invention.

As illustrated in FIG. 9, the memory cell array region 10 according to this mode of embodiment differs from the memory cell array region 10 illustrated in FIG. 2 in that hierarchical switches HSW5 and HSW6 have been added. Further, FIG. 9 illustrates an example in which, in order to provide a region in the hierarchical sense amplifier HSA in which to dispose the hierarchical switches HSW5 and 6, the hierarchical switches HSW1 and 3 are disposed on the submat SMAT1 and the hierarchical switches HSW2 and 4 are disposed on the submat SMAT2, but this mode of embodiment is not limited to this configuration. If there is spare space in the region in which the hierarchical sense amplifier HSA is disposed, the hierarchical switches HSW1 to 4 may be disposed on the hierarchical sense amplifier HSA side as illustrated in FIG. 2. Other points are the same as for the memory cell array region 10 illustrated in FIG. 2, and therefore the same reference codes are appended to the same elements, and duplicate descriptions are omitted.

The hierarchical switch HSW5 comprises an n-channel MOS transistor connected between the signal node N1 of the hierarchical sense amplifier HSA and the global bit line GBLT, and a connection signal TG5 is supplied to the gate electrode thereof. Further, the hierarchical switch HSW6 comprises an n-channel MOS transistor connected between the signal node N2 of the hierarchical sense amplifier HSA and the global bit line GBLT, and a connection signal TG6 is supplied to the gate electrode thereof. Thus the hierarchical switches HSW5 and HSW6 are connected directly to the signal nodes N1 and N2 of the hierarchical sense amplifier HSA, and they can therefore connect the hierarchical sense amplifier HSA to the global bit line GBLT even if all the selection switches SELSW1 to SELSW4 are in the off state.

Figure 10:
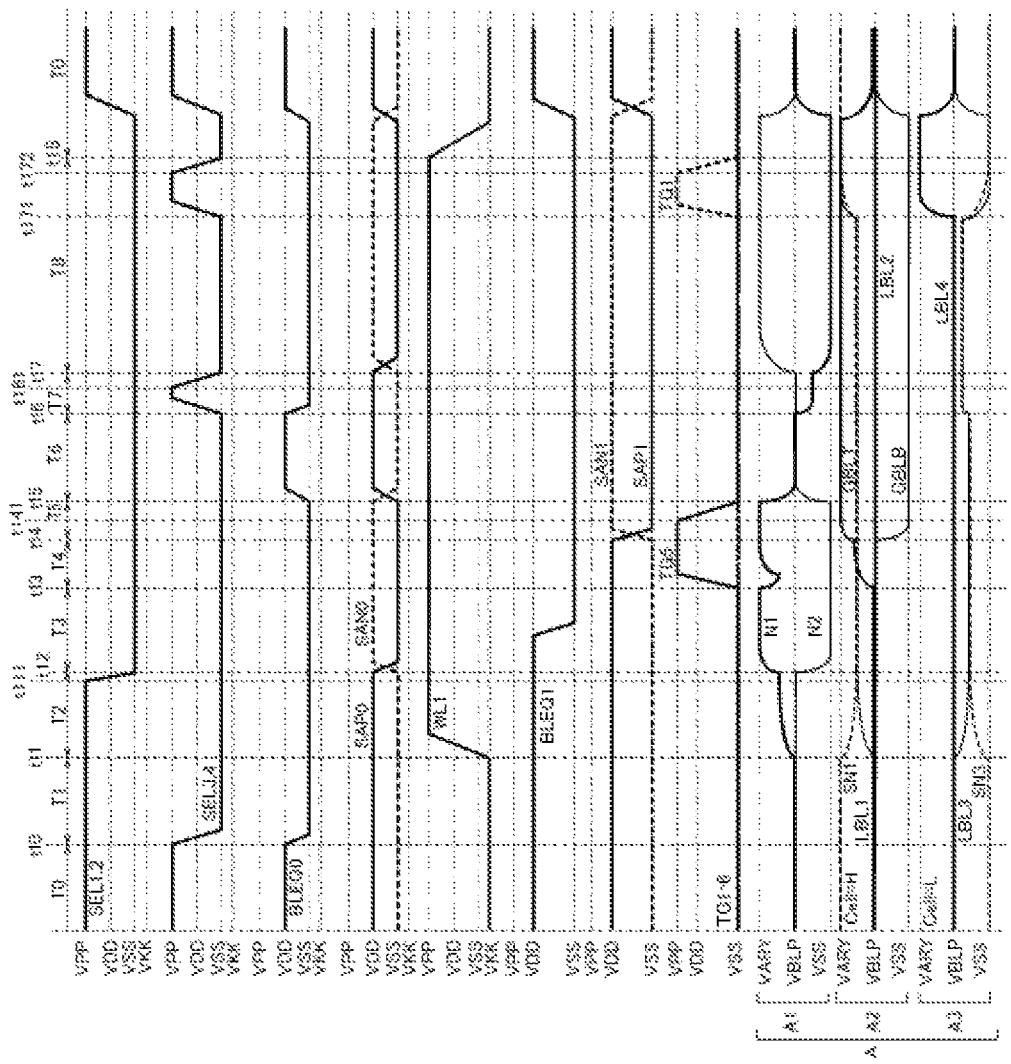
FIG. 10 is an operational waveform diagram used to describe the operation of a semiconductor device according to the second mode of embodiment of the present invention during a read operation.

FIG. 10 is an operational waveform diagram used to describe the operation of the semiconductor device according to this mode of embodiment during a read operation. In FIG. 10, the same reference codes have been appended to timings and periods corresponding to the timings and periods illustrated in FIG. 3. This is also the case in FIG. 11, FIG. 13 and FIG. 14 discussed hereinafter.

A period T0 up to a time t10 illustrated in FIG. 10 is a precharge period prior to the time at which the row access is performed. During the period T0, the selection signals SEL1 to SEL4 are all at the high level, and the connection signals TG1 to TG6 are all at the low level. In other words, the state is such that the local bit lines LBL1 to LBL4 are disconnected from the global bit line GBLT, and the local bit lines LBL1 to LBL4 are connected to the hierarchical sense amplifier HSA. Further, the equalizing signals BLEQ0 and BLEQ1 are both at the high level, and therefore the global bit line GBLT and the local bit lines LBL1 to LBL4 are all precharged to the intermediate potential VBLP.

If in this state the row address RA is input in synchronism with an active command, then the control circuit 18 and the row-system control circuit 11 illustrated in FIG. 1 begin the row access described hereinbelow. The following description describes an example in which the row address RA indicating the memory cell MC1 illustrated in FIG. 9 is input. It should be noted that the following operation is executed mainly under the control of the control circuit 18 and the row-system control circuit 11.

When the row address RA indicating the memory cell MC1 is input, at the time t10 the equalizing signal BLEQ0 is changed to the low level, and the selection signals SEL3 and SEL4 are changed to the low level. By this means, the precharge state of the local bit lines LBL1 to LBL4 is released, and the local bit lines LBL3 and LBL4 are isolated from the hierarchical sense amplifier HSA. The local bit lines LBL1 and LBL2 remain in a state in which they are connected to the hierarchical sense amplifier HSA. This operation continues until a time t11. A period T1 between the times t10 and t11 is a period for release of the precharge state.

At the time t11, the word line WL1 changes from a VKK level to a VPP level. The cell capacitors C, which are constituents of the memory cells MC1 and MC3, are thus connected respectively to the corresponding local bit lines LBL1 and LBL3. If high-level and low-level data are being held in the memory cells MC1 and MC3 respectively, then charge sharing causes the electric potential of the local bit line LBL1 to rise slightly from the intermediate potential VBLP, and the electric potential of the local bit line LBL3 to fall slightly from the intermediate potential VBLP. During the corresponding period T2, the selection switch SELSW1 is on and the selection switch SELSW3 is off, and therefore the electric potential of the signal node N1 rises, as indicated by the reference code A1. It should be noted that the electric potential of the signal node N2 remains at the intermediate potential VBLP.

Next, before the sense activation signals SAP0 and SAN0 are activated at a time t12, the selection signals SEL1 and SEL2 are returned to the low level at a time t111. All the selection switches SELSW1 to SELSW4 thus enter the off state while an electric potential difference is being generated between the signal nodes N1 and N2.

Then, at the time t12, the sense activation signals SAP0 and SAN0 are activated, and the electric potential difference generated between the signal nodes N1 and N2 is amplified. Therefore the signal node N1 is driven to the power-supply potential VARY and the signal node N2 is driven to the ground potential VSS. However, because at this point in time all the selection switches SELSW1 to SELSW4 are off, the electric potentials of the local bit lines LBL1 to LBL4 do not change, and are maintained at the initial electrical potentials immediately after reading. In other words, because the local bit lines LBL1 and LBL2 are not being driven at this point in time, noise resulting from variations in the electric potentials of the local bit lines LBL1 and LBL2 does not affect the adjacent local bit lines LBL3 and LBL4.

Further, concurrent with the abovementioned sensing operation, the equalizing signal BLEQ1 is changed to the low level, and therefore the precharge state of the global bit lines GBLT and GBLB is released. These operations continue until a time t13. A period T3 between the times t12 and t13 is a period for amplification of the electric potential of the signal nodes N1 and N2.

Then, at the time t13, the connection signal TG5 is activated to the VPP level, turning the hierarchical switch HSW5 on. The other connection signals TG1 to TG4 and TG6 are maintained in an inactive state. By this means, the signal node N1 is connected to the global bit line GBLT, and charge sharing takes place between the signal node N1 and the global bit line GBLT. Therefore the electric potential of the global bit line GBLT rises, as indicated by the reference code A2. The electric potential of the other global bit line GBLB is maintained at the intermediate potential VBLP, and therefore an electric potential difference is generated between the signal nodes N3 and N4 of the global sense amplifier GSA.

At a time t14, the sense activation signals SAP1 and SAN1 are activated, and the electric potential difference generated between the signal nodes N3 and N4 is amplified. Therefore, as indicated by the reference code A2, the global bit line GBLT is driven to the power-supply potential VARY and the global bit line GBLB is driven to the ground potential VSS. However, at this point in time the local bit lines LBL1 to LBL4 are being maintained at the initial electrical potentials immediately after reading, and therefore the data read from the memory cells MC1 and MC3 have not been re-stored. The data are re-stored by means of the following procedure.

First, at a time t141 the connection signal TG5 is returned to the VSS level, thereby turning the hierarchical switch HSW5 off. Next, at a time t15 the equalizing signal BLEQ0 is activated. By this means, the signal nodes N1 and N2 in the hierarchical sense amplifier HSA are again precharged to the intermediate potential VBLP. This operation continues until a time t16. A period T6 between the times t15 and t16 is a re-precharge period for re-storing of the data to the memory cell MC3.

Next, at the time t16 the equalizing signal BLEQ0 is deactivated and the selection signals SEL3 and SEL4 are changed to the high level. By this means, the selection switches SELSW3 and SELSW4 are turned on, and therefore the local bit lines LBL3 and LBL4 are respectively connected to the signal nodes N1 and N2 of the hierarchical sense amplifier HSA. Therefore, as indicated by the reference code A1, the electric potential of the signal node N1 falls slightly from the intermediate potential VBLP.

Next, before the sense activation signals SAP0 and SAN0 are activated at a time t17, the selection signals SEL3 and SEL4 are returned to the low level at a time t161. Thus all the selection switches SELSW1 to SELSW4 again enter the off state while an electric potential difference is being generated between the signal nodes N1 and N2.

Then, at a time t17, the sense activation signals SAP0 and SAN0 are activated, and the electric potential difference generated between the signal nodes N1 and N2 is amplified. Therefore the signal node N1 is driven to the ground potential VSS and the signal node N2 is driven to the power-supply potential VARY. However, because at this point in time all the selection switches SELSW1 to SELSW4 are off, the electric potentials of the local bit lines LBL1 to LBL4 do not change, and are maintained at the initial electrical potentials immediately after reading.

The state achieved by means of the operations discussed hereinabove is such that the data read from the memory cell MC1 are held in the global sense amplifier GSA, and the data read from the memory cell MC3 are held in the hierarchical sense amplifier HSA. However, at this point in time the data have not yet been re-stored. During this interval, a column access can be executed by inputting the column address CA in synchronism with a read command.

Then, during a period between a time t171 and a time t172, the connection signal TG1 and the selection signals SEL3 and SEL4 are activated. The hierarchical switch HSW1 and the selection switches SELSW3 and SELSW4 are thus turned on, and therefore the data being held in the global sense amplifier GSA are re-stored to the memory cell MC1 by way of the hierarchical switch HSW1, and the data being held in the hierarchical sense amplifier HSA are re-stored to the memory cell MC3 by way of the selection switch SELSW3.

When a precharge command is subsequently issued, at a time t18 the word line WL1 is deactivated, all the selection signals SEL1 to SEL4 are set to the high level and all the selection signals TG1 to TG6 are set to the low level. Further, both equalizing signals BLEQ0 and BLEQ1 are set to the high level. In other words, the state returns to the same state as that up to the time t10, and the next row access can be executed.

The read operation in the semiconductor device according to this mode of embodiment is as described above. Thus in this mode of embodiment, the hierarchical sense amplifier HSA is activated while all the selection switches SELSW1 to SELSW4 have been set to the off state, and therefore the effects of signal noise between the local bit lines can be eliminated. It should be noted that in the example illustrated in FIG. 10, the re-storing operation to the memory cell MC1 is executed simultaneously with the re-storing operation to the memory cell MC3, but these operations need not be executed simultaneously.

Figure 11:
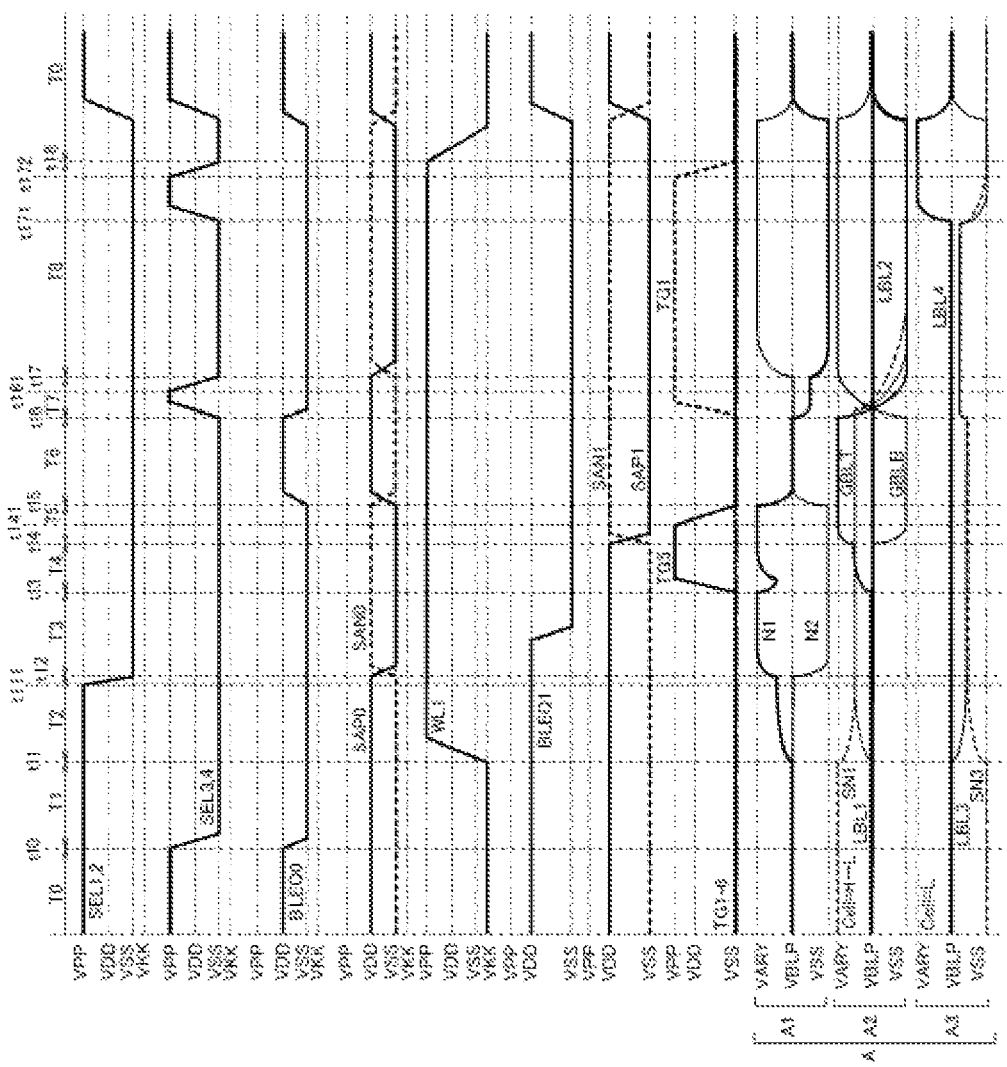
FIG. 11 is an operational waveform diagram used to describe the operation of the semiconductor device according to the second mode of embodiment of the present invention during a write operation.

FIG. 11 is an operational waveform diagram used to describe the operation of the semiconductor device according to this mode of embodiment during a write operation.

As illustrated in FIG. 11, the write operation in the semiconductor device according to this mode of embodiment is essentially the same as the read operation illustrated in FIG. 10. In the example illustrated in FIG. 11, the write data are input at the time t16, thereby inverting the electric potentials of the global bit lines GBLT and GBLB. Thus in the re-storing operation performed in the period between the time t171 and the time t172, the write data being held in the global sense amplifier GSA are written to the memory cell MC1 by way of the hierarchical switch HSW1. It should be noted that in the example illustrated in FIG. 11, the write operation to the memory cell MC1 is executed simultaneously with the re-storing operation to the memory cell MC3, but these operations need not be executed simultaneously.

A third mode of embodiment of the present invention will now be described.

Figure 12:
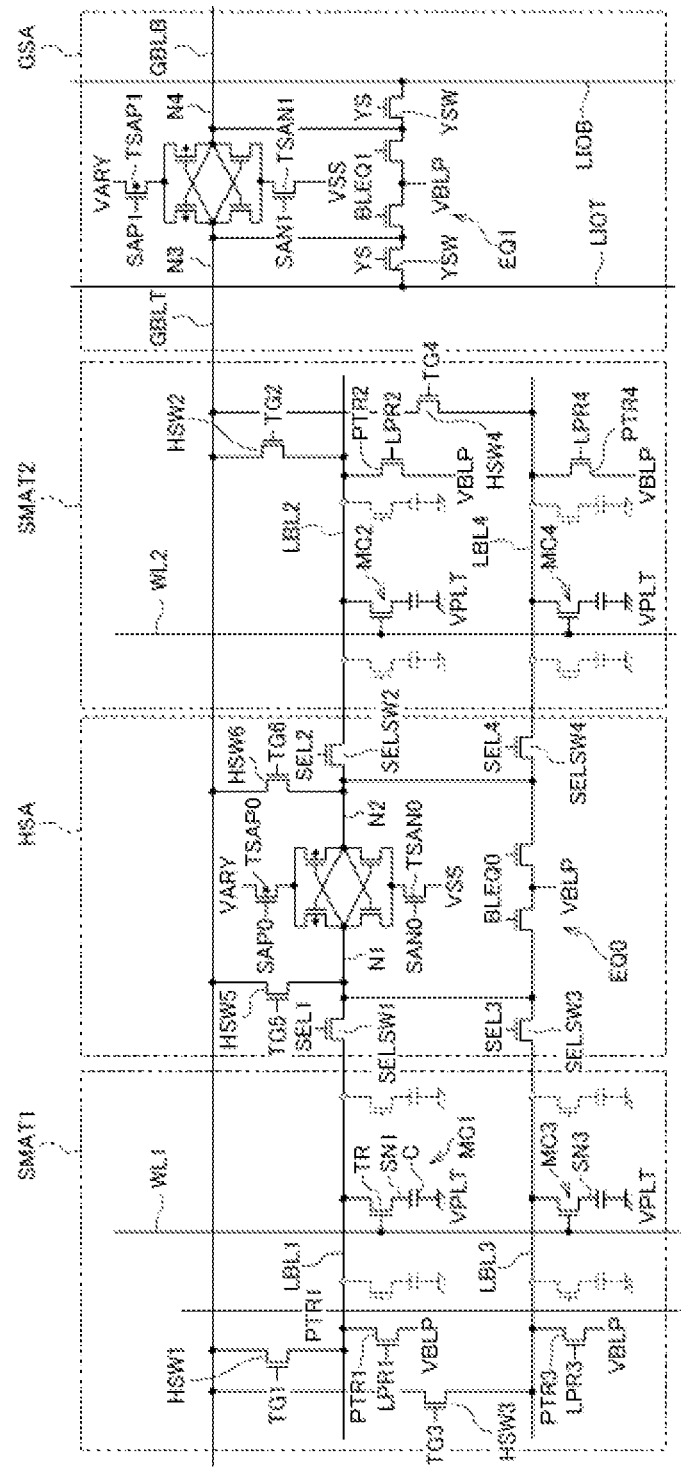
FIG. 12 is a circuit diagram used to describe the circuit configuration of a memory cell array region 10 according to a third mode of embodiment of the present invention.

FIG. 12 is a circuit diagram used to describe the circuit configuration of the memory cell array region 10 according to the third mode of embodiment of the present invention.

As illustrated in FIG. 12, the memory cell array region 10 according to this mode of embodiment differs from the memory cell array region 10 illustrated in FIG. 9 in that precharging transistors PTR1 to PTR4 have been added. Other points are the same as for the memory cell array region 10 illustrated in FIG. 9, and therefore the same reference codes are appended to the same elements, and duplicate descriptions are omitted.

The precharging transistors PTR1 to PTR4 comprise n-channel MOS transistors connected respectively between the local bit lines LBL1 to LBL4 and wiring lines to which the intermediate potential VBLP is supplied, and precharging signals LPR1 to LPR4 are supplied to the gate electrodes thereof. The precharging transistors PTR1 to PTR4 are transistors for directly precharging the local bit lines LBL1 to LBL4, and this mode of embodiment is characterized by the provision of said transistors.

Figure 13:
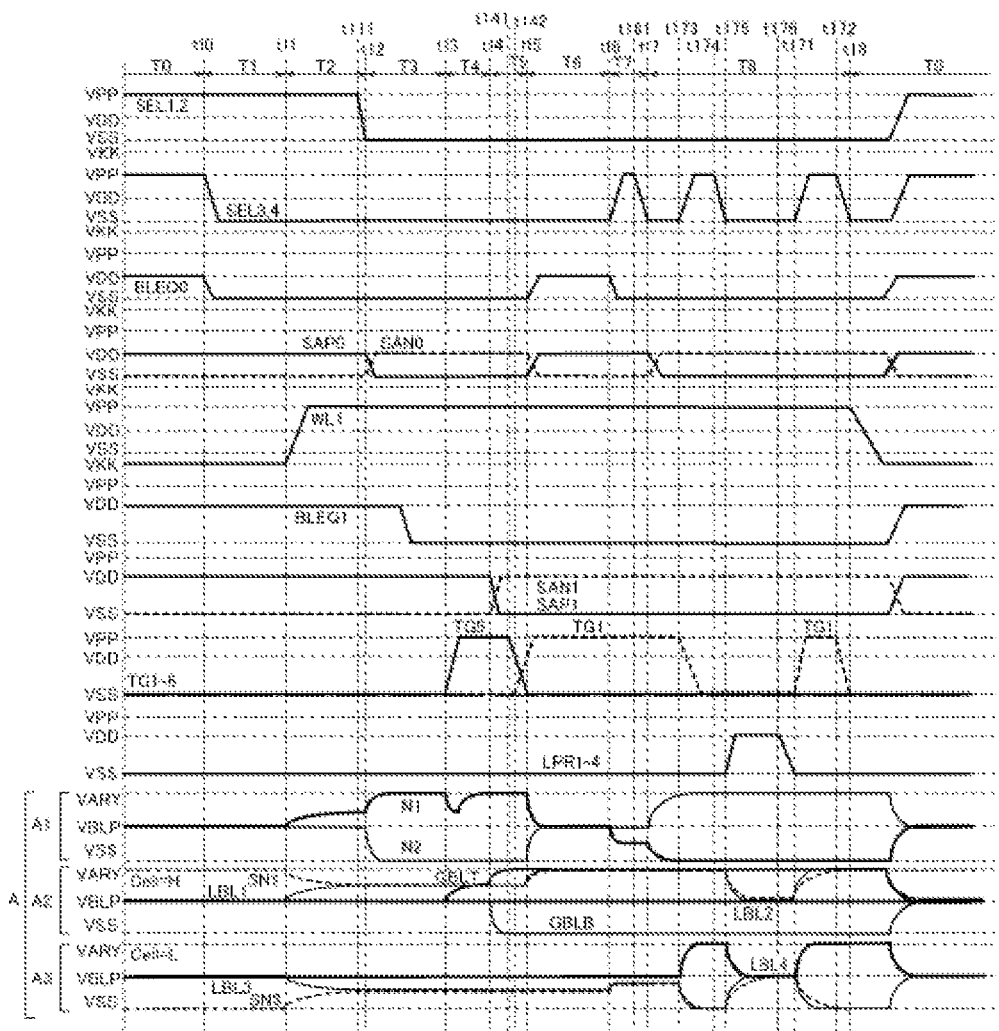
FIG. 13 is an operational waveform diagram used to describe the operation of a semiconductor device according to the third mode of embodiment of the present invention during a read operation.

FIG. 13 is an operational waveform diagram used to describe the operation of the semiconductor device according to this mode of embodiment during a read operation.

The read operation in this mode of embodiment is essentially the same as the operation described with reference to FIG. 10, but as illustrated in FIG. 13, the operation differs from the operation illustrated in FIG. 10 in that the connection signal TG1 is activated in a period between a time t142 and a time t173, the selection signals SEL3 and SEL4 are activated in a period between the time t173 and a time t174, and the precharging signals PTR1 to PTR4 are activated in a period between a time t175 and a time 176. Other operations are the same as for the operation described with reference to FIG. 10, and therefore duplicate descriptions are omitted.

In this mode of embodiment, because the connection signal TG1 is activated in the period between the time t142 and the time t173, the hierarchical switch HSW1 turns on in this period. Re-storing to the memory cell MC1 is thereby executed at this point in time. Further, because the selection signals SEL3 and SEL4 are activated in the period between the time t173 and the time t174, the selection signals SEL3 and SEL4 are turned on in this period. Re-storing to the memory cell MC3 is thereby executed at this point in time. It should be noted that in the example illustrated in FIG. 13, the timing (time t173) of the completion of the re-store to the memory cell MC1 coincides with the timing (time t173) of the start of the re-store to the memory cell MC3, but this point is not essential.

Then, when the precharging signals PTR1 to PTR4 are activated in the period between the time t175 and the time t176, the precharging transistors PTR1 to PTR4 are turned on, and the local bit lines LBL1 to LBL4 are directly precharged to the intermediate potential VBLP. Thus, during the period up until a precharge command is issued, the local bit lines LBL1 to LBL4 are maintained at the intermediate potential VBLP, and the loss of data as a result of what is known as a floating body effect can therefore be prevented.

The floating body effect is a phenomenon whereby the leakage current increases in a floating body transistor having an SOI (Silicon on Insulator) construction, for example, and if this occurs in a memory cell transistor, there is a risk that the charge accumulated in the cell capacitor will be lost. The floating body effect becomes pronounced if the electric potentials of the local bit lines are potentials that differ from the intermediate potential VBLP, and therefore the loss of charge can be suppressed to the minimum by maintaining the local bit lines at the intermediate potential VBLP.

In other words, in the second mode of embodiment discussed hereinabove, during the period up until when the data are re-stored to the memory cells MC1 and MC3, the data read from the memory cells MC1 and MC3 cause the electric potentials of the local bit lines LBL1 and LBL3 to differ from the intermediate potential VBLP. If this condition is maintained for an extended period of time there is a risk that the floating body effect will result in a loss of data from other memory cells connected to the local bit lines LBL1 and LBL3, but in this mode of embodiment the local bit lines LBL1 to LBL4 are directly precharged to the intermediate potential VBLP using the precharging transistors PTR1 to PTR4, before the precharge command is issued, and the loss of data as a result of the floating body effect can therefore be prevented.

It should be noted that it is not essential for the precharging transistors PTR1 to PTR4 to be turned on simultaneously, and the precharging transistors PTR1 to PTR4 may be controlled individually. For example, the precharging transistors PTR1 and PTR2, and the precharging transistors PTR3 and PTR4 may be turned on or off with different timings.

Although not illustrated in the drawings, in the write operation in this mode of embodiment the write data should be written to the global sense amplifier GSA in the period between the time t142 and the time t173.

Figure 14:
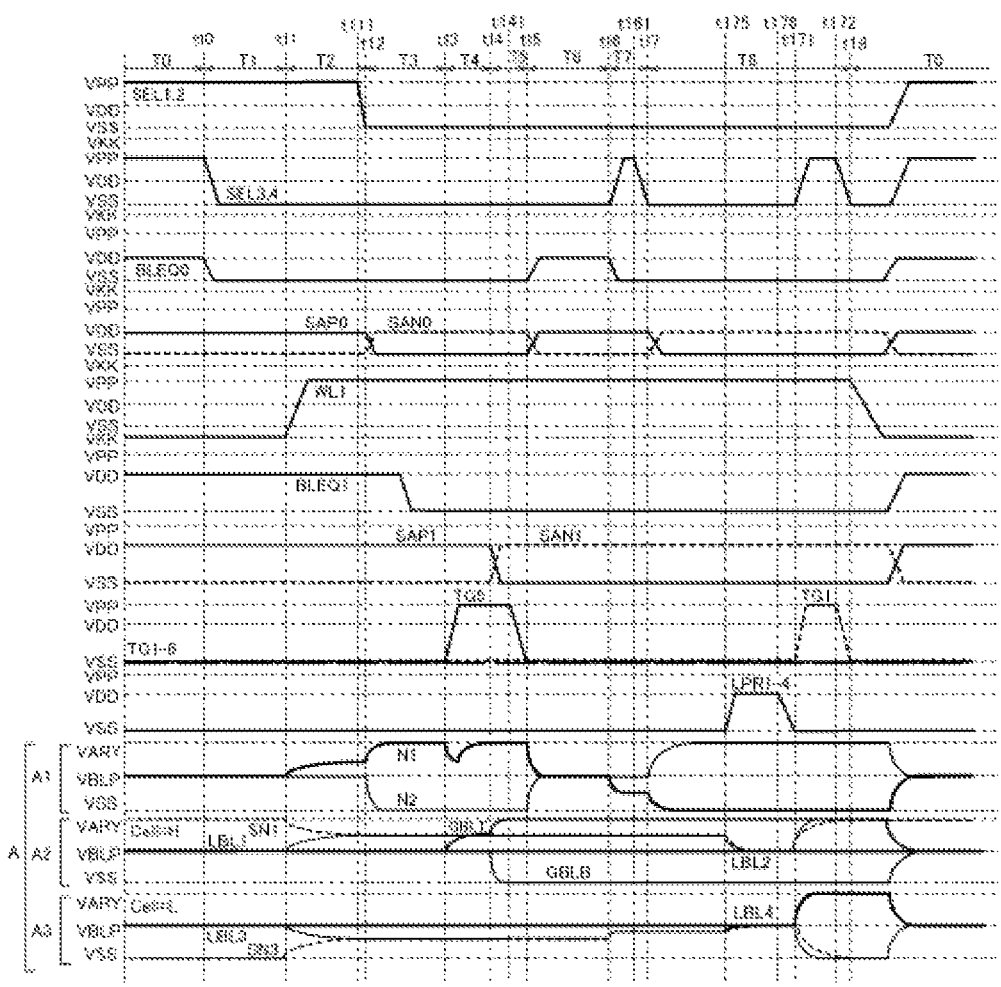
FIG. 14 is an operational waveform diagram used to describe a modified example of the operation of the semiconductor device according to the third mode of embodiment of the present invention during a read operation.

FIG. 14 is an operational waveform diagram used to describe a modified example of the operation of the semiconductor device according to this mode of embodiment during a read operation.

The operation illustrated in FIG. 14 differs from the operation illustrated in FIG. 13 in that the operation to activate the connection signal TG1 in the period between the time t142 and the time t173 and the operation to activate the selection signals SEL3 and SEL4 in the period between the time t173 and the time t174, illustrated in FIG. 13, are omitted. Other operations are the same as for the operations described with reference to FIG. 13, and therefore duplicate descriptions are omitted.

In the operation illustrated in FIG. 14, because the re-storing operation prior to the direct precharging of the local bit lines LBL1 to LBL4 has been omitted, the current consumption arising as a result of said operation can be reduced. It should be noted that with regard to the re-storing operation prior to the direct precharging of the local bit lines LBL1 to LBL4, the re-storing operations to both memory cells MC1 and MC3 may be omitted, as illustrated in FIG. 14, or the re-storing operation to only one of the memory cells may be omitted.

Preferred modes of embodiment of the present invention have been described hereinabove, but various modifications to the present invention may be made without deviating from the gist of the present invention, without limitation to the abovementioned modes of embodiment, and it goes without saying that these are also included within the scope of the present invention.

For example, in the first to third modes of embodiment described hereinabove, examples in which the present invention has been applied to a DRAM are described, but the scope of application of the present invention is not limited to this, and the present invention can also be applied to other types of memory-based devices, and can also be applied to logic-based devices which include a memory cell array region.

Further, in the first to third modes of embodiment described hereinabove, two pairs of local bit lines LBL are allocated to one hierarchical sense amplifier HSA, but the present invention is not limited to this configuration. Therefore one pair of local bit lines LBL may be allocated to one hierarchical sense amplifier HSA. Further, in the modes of embodiment described hereinabove, the local bit lines LBL forming a pair belong to mutually different submats, but the local bit lines LBL forming a pair may belong to the same submat as one another.

Figure 8:
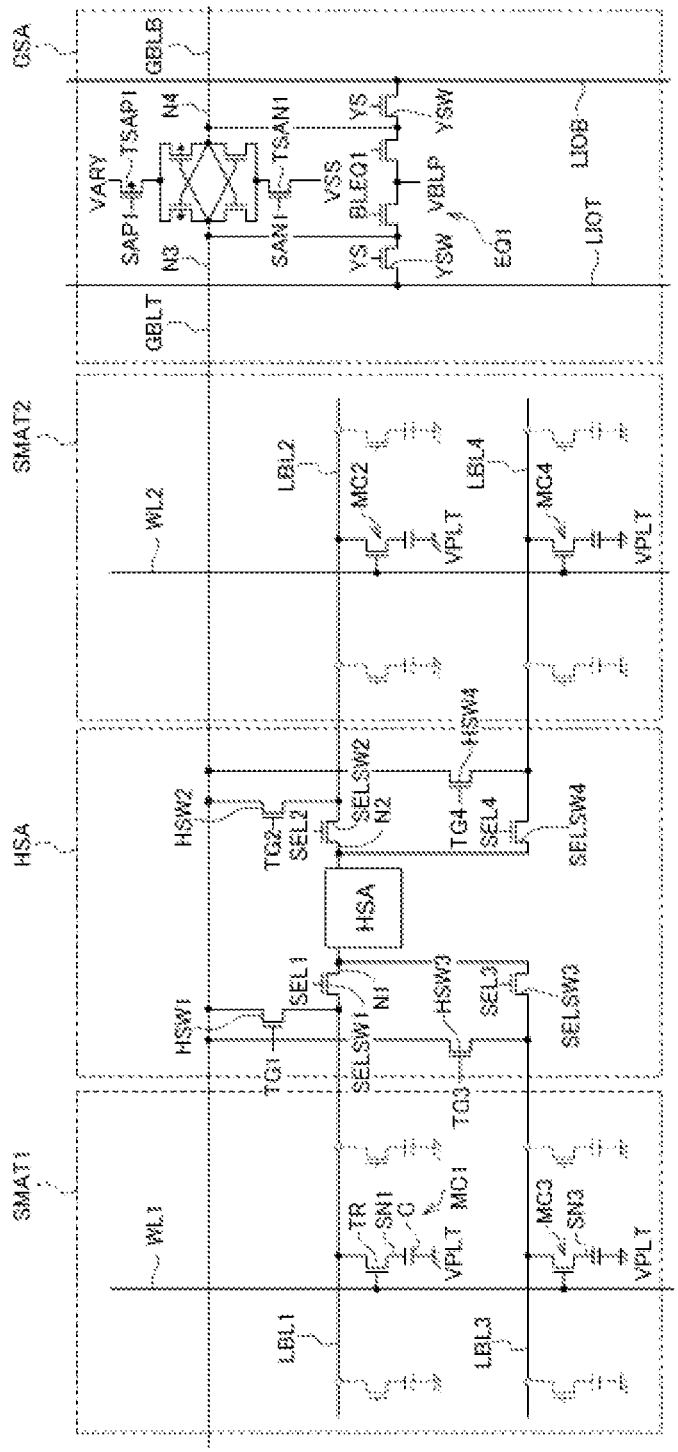
FIG. 8 is a generalized diagram of the hierarchical sense amplifier HSA illustrated in FIG. 2.

Further, there is no particular restriction to the specific circuit configuration of the hierarchical sense amplifier HSA in the present invention, and as illustrated in a generalized manner in FIG. 8, any circuit configuration can be adopted. It should be noted that in FIG. 8, elements having the same reference numbers as in the first mode of embodiment are the same as in the first mode of embodiment, and descriptions thereof are therefore omitted.

For example, a circuit can be employed as appropriate as the hierarchical sense amplifier HSA, provided that it is itself a sense amplifier capable of performing a re-storing operation, in other words a circuit of a type capable of amplifying a read signal on a selected local bit line LBL and feeding back the signal after amplification to said selected local bit line LBL.

Further, a description was given in which the hierarchical switches HSW1 and HSW2 are provided to the outside of the selection switches SELSW1 and SELSW2, in other words on the side on which the local bit lines LBL1 and LBL2 exist, but the hierarchical switches HSW1 and HSW2 may be provided between the selection switches SELSW1 and SELSW2 and the hierarchical sense amplifier HSA. Further, in the first to third modes of embodiment hereinabove, the hierarchical switches HSW1 and HSW2 are described as being used in common during reading and writing of data, but the hierarchical switches HSW1 and HSW2 may each be configured from a hierarchical switch for reading and a hierarchical switch for writing. In this case the configuration may be such that, as the hierarchical switches for reading and writing, an HSW1-Read and an HSW1-Write are provided on either side of the selection switch SELSW1, and an HSW2-Read and an HSW2-Write are provided on either side of the selection switch SELSW2.

EXPLANATION OF THE REFERENCE NUMBERS

10 Memory cell array region
11 Row-system control circuit
12 Column-system control circuit
13 Row address buffer
14 Column address buffer
15 Input/output control circuit
16 Data buffer
17 Command decoder 18 Control circuit
19 Mode register
C Cell capacitor
EQ0, EQ1 Equalizing circuit
GBLT, GBLB Global bit line
GSA Global sense amplifier
HSA Hierarchical sense amplifier
HSW1 to HSW6 Hierarchical switch
LBL1 to LBL4 Local bit line
LIOT, LIOB Local I/O line pair
MC1 to MC4 Memory cell
N1 to N4 Signal node
PTR1 to PTR4 Precharging transistor
SELSW1 to SELSW4 Selection switch
SMAT1, SMAT2 Submat
SN1, SN3 Storage node
TR Cell transistor
WL1, WL2 Word line
YSW Column switch

What is claimed is:

1. A semiconductor device comprising:
a global bit line;
a global sense amplifier which amplifies a signal on the global bit line;
first and second local bit lines;
a plurality of word lines which each intersect at least one of the first and second local bit lines;
a plurality of memory cells disposed at the points of intersection of the plurality of word lines and the first and second local bit lines;
first and second hierarchical switches connected respectively between the first and second local bit lines and the global bit line; and
a hierarchical sense amplifier which has first and second signal nodes and which amplifies an electric potential difference generated between the first and second signal nodes, wherein the first signal node is connected to the first local bit line, and the second signal node is connected to the second local bit line.

2. The semiconductor device of claim 1 comprising:
third and fourth local bit lines;
third and fourth hierarchical switches connected respectively between the third and fourth local bit lines and the global bit line;
first and third selection switches connected respectively between the first and third local bit lines and the first signal node; and
second and fourth selection switches connected respectively between the second and fourth local bit lines and the second signal node.

3. The semiconductor device of claim 2, wherein:
the plurality of word lines includes a first word line intersecting the first and third local bit lines, and a second word line intersecting the second and fourth local bit lines;
the plurality of memory cells includes first to fourth memory cells;
the first memory cell is disposed at the point of intersection of the first word line and the first local bit line;
the second memory cell is disposed at the point of intersection of the first word line and the third local bit line;
the third memory cell is disposed at the point of intersection of the second word line and the second local bit line; and
the fourth memory cell is disposed at the point of intersection of the second word line and the fourth local bit line.

4. The semiconductor device of claim 2, comprising a control circuit which performs a first operation in which it activates the hierarchical sense amplifier while the first and second selection switches are on and the third and fourth selection switches are off, and then turns on either the first hierarchical switch or the second hierarchical switch.

5. The semiconductor device of claim 4, wherein after the control circuit has performed the first operation, it performs a second operation in which it turns off the first and second selection switches and deactivates the hierarchical sense amplifier, and then turns on the third and fourth selection switches and reactivates the hierarchical sense amplifier.

6. The semiconductor device of claim 2, comprising:
a fifth hierarchical switch connected between the global bit line and the first signal node; and
a sixth hierarchical switch connected between the global bit line and the second signal node.

7. The semiconductor device of claim 6, comprising a control circuit which performs a first operation in which it generates an electric potential difference between the first and second signal nodes by temporarily turning the first and second selection switches on while the third and fourth selection switches are off, then activates the hierarchical sense amplifier while the first and second selection switches are off, and then turns either the fifth hierarchical switch or the sixth hierarchical switch on.

8. The semiconductor device of claim 7, wherein after the control circuit has performed the first operation, it performs a second operation in which it generates an electric potential difference between the first and second signal nodes by temporarily turning the third and fourth selection switches on while the first and second selection switches are off, then activates the hierarchical sense amplifier while the third and fourth selection switches are off, and then turns on either the first hierarchical switch or the second hierarchical switch, and the third and fourth selection switches.

9. The semiconductor device of claim 2, comprising a fifth local bit line connected to another hierarchical sense amplifier and disposed between the first local bit line and the third local bit line, and a sixth local bit line connected to yet another hierarchical sense amplifier and disposed between the second local bit line and the fourth local bit line.

10. The semiconductor device of claim 2, wherein the first local bit line and the third local bit line are disposed adjacent to one another without another wiring line being interposed therebetween, and the second local bit line and the fourth local bit line are disposed adjacent to one another without another wiring line being interposed therebetween.

11. The semiconductor device of claim 2, wherein it is additionally provided with first to fourth precharging circuits which respectively supply prescribed electric potentials to the first to fourth local bit lines.

12. The semiconductor device of claim 1, wherein the hierarchical sense amplifier has a flip-flop configuration.

13. The semiconductor device of claim 12, wherein it is additionally provided with a first equalizing circuit which supplies a prescribed electric potential to the first and second signal nodes.

14. The semiconductor device of claim 1, wherein the global sense amplifier amplifies an electric potential difference generated between third and fourth signal nodes, and the third signal node is connected to the global bit line, and the fourth signal node is connected to another global bit line.

15. The semiconductor device of claim 14, wherein the global sense amplifier has a flip-flop configuration.

16. The semiconductor device of claim 15, wherein it is additionally provided with a second equalizing circuit which supplies a prescribed electric potential to the third and fourth signal nodes.

17. The semiconductor device of claim 1, comprising:
- a first selection switch connected between the first local bit line and the first signal node;
- a second selection switch connected between the second local bit line and the second signal node; and
- a control circuit which activates the hierarchical sense amplifier while the first and second selection switches are on, and then turns on either the first hierarchical switch or the second hierarchical switch.

18. A semiconductor device comprising:
- a global bit line;
- a global sense amplifier which amplifies a signal on the global bit line;
- first and second local bit lines;
- a plurality of word lines which each intersect both the first and second local bit lines;
- a plurality of memory cells disposed at the points of intersection of the plurality of word lines and the first and second local bit lines;
- first and second hierarchical switches connected respectively between the first and second local bit lines and the global bit line;
- an amplification circuit which has a first signal node and which amplifies a signal supplied to the first signal node to either a first level or a second level;
- a first selection transistor provided between the first signal node and the first local bit line; and
- a second selection transistor provided between the first signal node and the second local bit line.

19. The semiconductor device of claim 18, comprising a third hierarchical switch connected between the global bit line and the first signal node.

20. The semiconductor device of claim 18, wherein the first local bit line and the second local bit line are local bit lines disposed adjacent to one another.

21. The semiconductor device of claim 18, wherein the hierarchical sense amplifier is provided with a second signal node, a third local bit line connected to the second signal node by way of a third selection transistor, and a fourth local bit line connected to the second signal node by way of a fourth selection transistor.

22. The semiconductor device of claim 18, wherein the amplification circuit amplifies the electric potential of the first node to either the first level or the second level on the basis of the electric potential of either the first local bit line or the second local bit line, connected by either the first selection transistor or the second selection transistor.

23. The semiconductor device of claim 18, comprising first and second precharging circuits which respectively supply prescribed electric potentials to the first and second local bit lines.

* * * * *